(12) United States Patent
Grant

(10) Patent No.: US 6,231,933 B1
(45) Date of Patent: May 15, 2001

(54) METHOD AND APPARATUS FOR METAL OXIDE CHEMICAL VAPOR DEPOSITION ON A SUBSTRATE SURFACE

(75) Inventor: Robert W. Grant, Allentown, PA (US)

(73) Assignee: Primaxx, Inc., Allentown, PA (US)

( * ) Notice: Subject to any disclaimer, the term of this patent is extended or adjusted under 35 U.S.C. 154(b) by 0 days.

(21) Appl. No.: 09/272,036

(22) Filed: Mar. 18, 1999

(51) Int. Cl.$^7$ .............................. C23C 16/455
(52) U.S. Cl. .................. 427/565; 427/248.1; 427/255.5
(58) Field of Search .................. 427/565, 248.1, 427/255.5

(56) References Cited

U.S. PATENT DOCUMENTS

| | | | |
|---|---|---|---|
| 4,705,700 | 11/1987 | Ikeda et al. | 117/98 |
| 4,916,089 | 4/1990 | Van Suchtelen et al. | 117/93 |
| 4,969,416 | 11/1990 | Schumaker et al. | 118/725 |
| 5,037,775 | 8/1991 | Reisman | 438/488 |
| 5,273,932 | 12/1993 | Sugiura et al. | 117/103 |
| 5,288,327 | 2/1994 | Bhat | 118/719 |
| 5,365,877 | 11/1994 | Kubota | 117/93 |
| 5,433,169 | 7/1995 | Nakamura | 117/102 |
| 5,755,878 | 5/1998 | Habuka et al. | 117/90 |
| 5,814,561 | 9/1998 | Jackson | 438/680 |
| 5,998,303 | * 12/1999 | Sato . | |

FOREIGN PATENT DOCUMENTS

| | | |
|---|---|---|
| 1-317112 | * 12/1989 | (JP) . |
| 5-144657 | * 6/1993 | (JP) . |
| 6-283449 | * 10/1994 | (JP) . |
| 8-115911 | * 5/1996 | (JP) . |

OTHER PUBLICATIONS

Hermann Schlichting, *Boundary Layer Theory*, Seventh Edition, Chapter V, Section b, and Chapter XV, Sections a and e. (No date available).

* cited by examiner

Primary Examiner—Timothy Meeks
(74) Attorney, Agent, or Firm—Hugh D. Jaeger

(57) ABSTRACT

A method and apparatus for improved metal oxide chemical vapor deposition on a substrate surface where the application boundary layer is reduced and where the uniformity of the application boundary layer is greatly enhanced in a reactor. Primary and secondary sonic or other disturbance sources are incorporated for introducing disturbance into the interior chamber of the reactor, or an oscillating or vibrating chuck is incorporated within the interior chamber, to influence the boundary layer thickness and uniformity.

29 Claims, 2 Drawing Sheets

METHOD AND APPARATUS FOR METAL OXIDE CHEMICAL VAPOR DEPOSITION ON A SUBSTRATE SURFACE

BACKGROUND OF THE INVENTION

1. Field of the Invention

The present invention relates to a chemical vapor deposition (CVD), and more particularly, pertains to a method and apparatus for metal oxide chemical vapor deposition (MOCVD) upon a substrate surface.

2. Description of the Prior Art

Several difficulties in prior art metal oxide chemical vapor deposition have been found to be prevalent in the deposition of metal oxide chemical vapors upon a substrate, such as a wafer utilized for micro-chip manufacturing or other purposes. Difficulties encountered during deposition are mostly created by (a) undesirable topology on the substrate surface, (b) non-uniform heating of the substrate, and (c) a non-uniform gas boundary layer along and about the substrate.

The first problem in MOCVD is related to undesirable and inherent substrate topology where at low pressures, such as 1 Torr at which MOCVD best takes place, the different vapor components necessary to thermally decompose on a wafer surface in perfect stoichiometry for a particularly useful compound must arrive at the wafer surface at the correct ratio. If the wafer surface were always flat, this ratio could be achieved by simply altering the relative mixture of the vapors, i.e., 10/90 percent to 11/89 percent. However, in useful cases in integrated circuit construction, inherent uneven topology is usually present, i.e., 0.50 micron high plateaus with 0.25 micron spaces. In this case, each vapor component must arrive not only at the top of the topology features at the correct ratio, but must also arrive at the bottom of the topology features at the same ratio. If the deposition ratio is not maintained, then the composition of the complex metal oxide will be non-uniform and will not be useful. Since a gas boundary layer is usually present for a chemical vapor deposition (CVD) reactor with flowing gases of about 0.80 cm at 760 Torr, for example, for an 8-inch wafer $b1=2/3L(v/UL)^{0.50}$, each vapor component must replenish the boundary layer. Furthermore, different depths within the boundary layer must get the same ratio of vapors in order to allow uniform compositions to form from thermal decomposition. Generally, different metallorganic vapors diffuse at different speeds, as do most gases in general. The basic problem with the current art and prior art is that on uneven topography, uniform compound electrical and crystalline control is difficult, at best. Since the use of the dozens of new complex metal oxides will become prevalent, it is important to develop production methods to deposit the compounds that have been studied in planar applications.

The solution to the uneven topology problem, such as presented by the present invention, is to artificially reduce the boundary layer to significantly smaller and uniform thickness, such as in microns. The boundary layer thickness can be significantly reduced and the boundary layer uniformity can be enhanced and stabilized by any one method or combinations of methods including the use of an externally generated periodically disturbed gas motion in the form of a pressure wave, or by moving or oscillating the wafer itself, or by changing the pressure of the injected gas, any or all in the range of Hz through kilo Hz. With reference to reducing boundary layer thickness, Appendix A is attached. For example, $b1=(v/pi.fr.d)$ where v=viscosity, pi is 3.14, fr=frequency, and d=density of the gas. Appendix A is a spreadsheet relating to various fluids and gases over an 8-inch wafer with no disturbance, and with either 40,000 Hz for water or 10 Hz for the $N_2$ and argon, where the change in boundary layer (b1) is orders of magnitude.

If the boundary layer is made small, then the compound variation due to differential diffusion lengths will also be small, thereby offering a solution for the problem of two and three chemical component MOCVD. An additional benefit is the speeding up of the deposition rate, since most MOCVD reactions are limited by the delivery to the surface through a thick boundary layer.

The second and third prior art problems in MOCVD are the creation of uniform heating and a uniform gas boundary layer of any thickness. Improved uniformity of the gas layer boundary is accomplished in the present invention in part or wholly as previously described. Usually, a prior art rotating wafer in a downflow creates a uniform boundary layer, independent of scale. The speed of rotation controls, to a certain extent, the thickness. Physical rotation is limited by a vacuum rotating seal and particle problems in prior art devices. Rotation is also helpful or necessary in creating uniform lamp heating and is the subject of several existing patents, such as in Applied Materials, etc. If a prior art stationary platen is used to heat the wafer uniformly, then the gas boundary layer will be non-uniform from the center to the edge, with the center being thicker and the edge being a thinner boundary layer, or the gradient will either increase or decrease from left to right accordingly. The preferred embodiment of the present invention provides for crossflow longitudinally and laterally along the wafer structure. If prior art rotation is used to make the boundary layer uniform, then a rotating vacuum seal is necessary, and lamp heating is necessary which is inherently non-uniform due to re-radiation differences at the edges of the wafer where radiation emits from all sides instead of just one side. Usually prior art multiple heat zones and multiple pyrometer feedback zones are used to compensate for non-uniformities. As well as gas delivery uniformity, temperature drives the reaction, so temperature uniformity is critical. The present invention eliminates the need for pyrometry since it is non-rotating and allows the use of thermocouples embedded in a heated chuck. Multiple heat zones are eliminated since a large mass, thermally conductive heated chuck is used.

In the present invention, the new boundary layer created by the periodical disturbance of gas motion stabilizes the boundary layer thickness and reduces the usual thick boundary layer to a mere fraction; and gas delivery and temperature uniformity are achieved utilizing simple reactor construction. The vapors or gases are sent into the interior chamber of the reactor with associated pressure waves transmitted by a transducer, by a vibrating or oscillating chuck, or by other suitable devices.

SUMMARY OF THE INVENTION

The present invention provides a method and apparatus for metal oxide chemical vapor deposition on a substrate involving use of a downflow reactor or a crossflow reactor which includes means for generating a sonic or other disturbance within an interior chamber of the reactor to improve boundary layer characteristics. Several types of reactors can be utilized, but either a downflow reactor or a crossflow reactor is favored; and of these, the crossflow reactor is preferred. The crossflow reactor is a cold wall vacuum reactor comprising a horizontally oriented vessel having an interior chamber defined by a surrounding vessel wall about and to which related structure and devices are attached or extend therefrom. A chuck for holding a substrate is centrally located externally along the vessel and extends slightly through the vessel wall to place a substrate carried thereby within the interior chamber in a position substantially flush with the interior surface of the vessel wall. The chuck includes an embedded resistance heater for heating its surface, thereby enhancing boundary layer uniformity. A gas inlet is located at one end of the vessel and a gas outlet is located at the opposing end of the vessel. A primary disturbance source and transducer capable of generating periodic disturbance in wave form are attached to the vessel wall at the gas outlet end for imparting periodic disturbance into the interior chamber of the vessel to influence boundary layer delivery of metal oxide chemical vapor to the substrate surface. The boundary layer is minimized by the periodic disturbance to provide for greatly reduced and desirable boundary layer thickness. The boundary layer uniformity is also enhanced by the generated periodic disturbance. An alternate disturbance source is provided at the gas inlet end of the vessel and is plumbed to the gas inlet. Further, an additional transducer providing yet another disturbance source is located along the vessel on the vessel wall.

In use, primary disturbance source and transducer at the gas outlet end can be used alone for introduction of periodic disturbance into the interior chamber of the vessel, but in the alternative, the additional transducer located on the vessel wall can be employed simultaneously. In similar fashion, the alternative disturbance source at the gas inlet end can be used alone for introduction of periodic disturbance into the interior chamber of the vessel, but in the alternative, the additional transducer located on the vessel wall can be employed simultaneously.

The downflow reactor is also a cold wall vacuum reactor and comprises a vertically oriented vessel having an interior chamber defined by a surrounding vessel wall about and to which related structure and devices are attached or extended therefrom. A chuck for holding a substrate is located centrally within the interior chamber, the chuck including an embedded resistance heater. A gas inlet is located at the upper region of the vessel and a gas outlet is located at the lower region of the vessel. A primary disturbance source for generating periodic disturbance in wave form into the interior chamber of the vessel is plumbed to the gas inlet. An alternate disturbance source and transducer capable of generating periodic disturbance into the interior chamber are attached to the vessel wall. Additional disturbance can be provided by arranging the chuck so that it can be vibrated or can be oscillated either vertically or horizontally, or simultaneously both vertically and horizontally.

As stated previously, the preferred reactor is the crossflow reactor since (1) the crossflow reactor limits the volume of gas required, and (2) the crossflow reactor provides an even heating from wafer to opposite surface to produce uniform thermal gradients.

One significant aspect and feature of the present invention is the reduction of boundary layer thickness to provide for improved metal oxide chemical vapor deposition on and about the uneven topology surfaces of a substrate.

Another significant aspect and feature of the present invention is improved uniformity of the boundary layer to provide for improved metal oxide chemical vapor deposition on and about the uneven topology surfaces of a substrate.

A further significant aspect and feature of the present invention is the use of primary and alternate sonic or other disturbance sources either singularly or in unison to reduce boundary layer thickness and to provide for uniformity of the boundary layer.

An additional significant aspect and feature of the present invention is the use of an oscillatible chuck to reduce boundary layer thickness and to provide for uniformity of the boundary layer.

Still another significant aspect and feature of the present invention is the use of an evenly heated chuck.

Yet another significant aspect and feature of the present invention is the use of a downflow reactor.

Still another significant aspect and feature of the present invention is the use of a crossflow reactor.

Having thus described embodiments and significant aspects and features of the present invention, it is the principal object of the present invention to provide a method and apparatus for metal oxide chemical vapor deposition on a substrate surface.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE TWO ILLUSTRATED EMBODIMENTS

Figure 1:
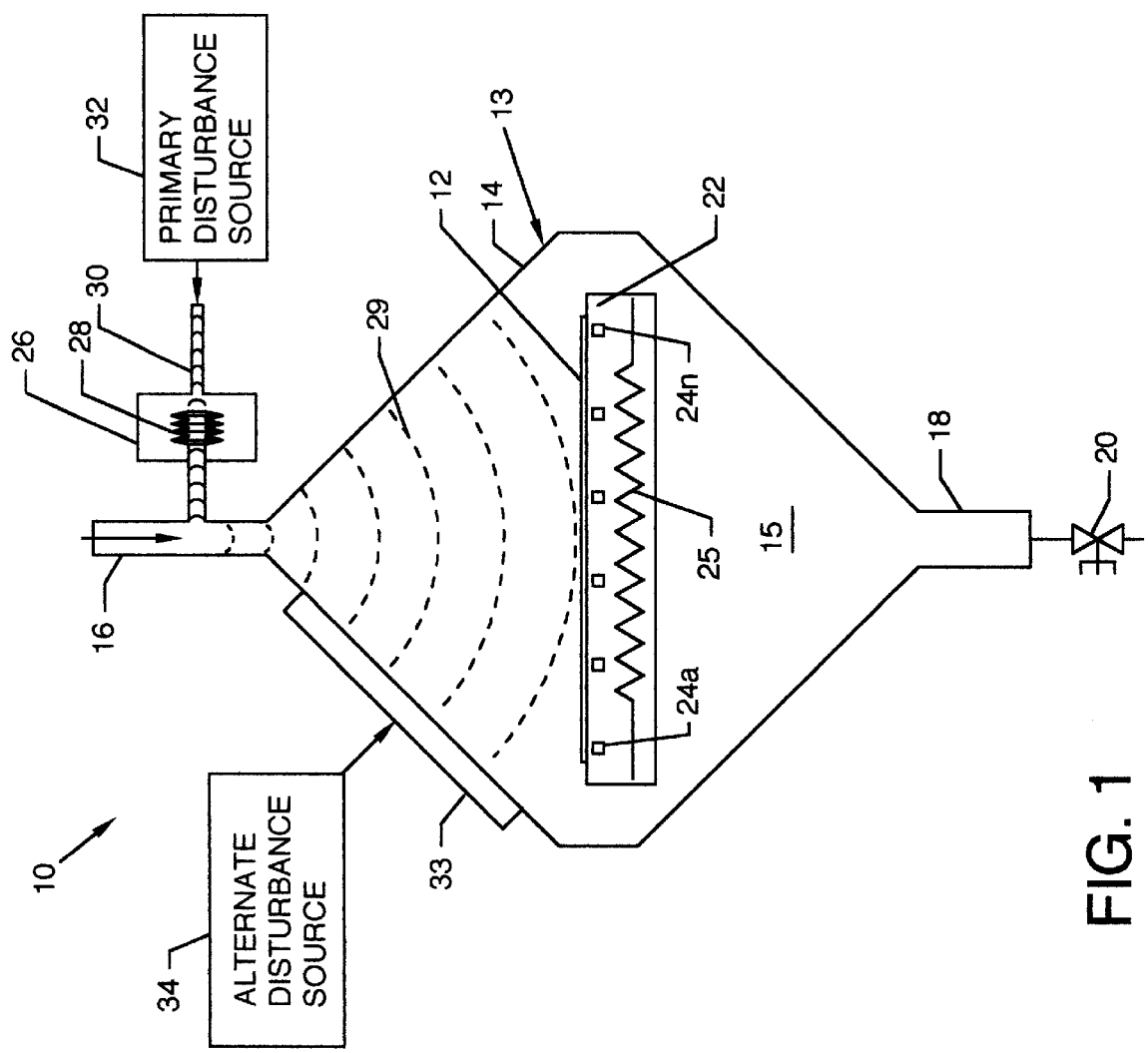
FIG. 1 illustrates the method and a downflow reactor apparatus for metal oxide chemical vapor deposition on a substrate surface; and, FIG. 2, the preferred embodiment, illustrates the method and a crossflow reactor apparatus for metal oxide chemical vapor deposition on one or more substrate surfaces.

FIG. 1 illustrates one method and apparatus according to the present invention for Metal Oxide Chemical Vapor Deposition on a substrate surface. A downflow reactor 10 apparatus is incorporated and utilized for Metal Oxide Chemical Vapor Deposition (MOCVD) upon the upper surface of a substrate 12 positioned central to the downflow reactor 10. The downflow reactor 10 is a cold wall vacuum reactor comprising a vertically oriented vessel 13 having an interior chamber 15 defined by a surrounding vessel wall 14 about and to which related structure and devices are attached or extend therefrom. A gas inlet 16 for receiving a gas from a Mass Flow Controller (MFC), not illustrated, is located at the upper region of the vessel 13. Opposing the gas inlet 16 and located at the lower region of the vessel 13 is a gas outlet 18 to which a metering valve 20 is attached for control of the gases transitting through the vessel 14. A thermally conductive chuck 22 of large mass and having a substrate holding portion is utilized to hold the wafer or substrate 12 during processing. The entire chuck 22 is located centrally within the interior chamber 15 of the vessel 13. A suitable resistance heater 25 and one or more thermocouples 24a–24n are embedded in the chuck 22 for heating the chuck 22 and for monitoring and controlling the temperature across the chuck 22. The large mass of the chuck 22 is conducive to achieving uniform and even temperature distribution across the chuck 22 to enhance boundary layer control. The chuck 22 normally remains static (stationary) during the deposition process, but is arranged so that, if necessary or desired, it can be vibrated or can be oscillated at a low frequency either vertically or horizontally, or in the alternative simultaneously both vertically and horizontally, to assist in control of reduced boundary layer thickness and to contribute to boundary layer uniformity control. A chamber 26 is located at and attached to the gas inlet 16 at the upper region of the vessel 13. An isolation bellows 28 is located in the chamber 26. An inlet 30 is attached to the chamber 26 to receive a disturbance input from a primary disturbance source 32. The primary disturbance source 32 introduces periodic disturbances in wave form into the interior chamber 15 of the vessel 13 of the downflow reactor 10 through the inlet 30, the chamber 26, the isolation bellows 28 and the gas inlet 16. The periodic disturbances emanating from the primary disturbance source 32, as indicated at 29 by dashed lines, can be provided by a device such as, but not limited to, a pneumatic oscillator which provides a sinusoidal disturbance. One or more transducers 33 and alternate disturbance sources 34 are attached to the vessel wall 14 and either acts alone for imparting a disturbance in wave form into the interior chamber 15 of the vessel 13 of the downflow reactor 10 or acts in concert with the primary disturbance source 32 to impart multiple or reinforced disturbances into the interior chamber 15 of the vessel 13 of the downflow reactor 10. In either case, the chuck 22 can be vibrated or can be oscillated in the manners mentioned above to impart further disturbance. Both the primary and the alternate disturbance sources 32 and 34, respectively, can include, but are not limited to, a pneumatic oscillator, a speaker, a piezo or other electromagnetic device, or a bellows with a pneumatic source, each of which generates an appropriate disturbance.

Figure 2:
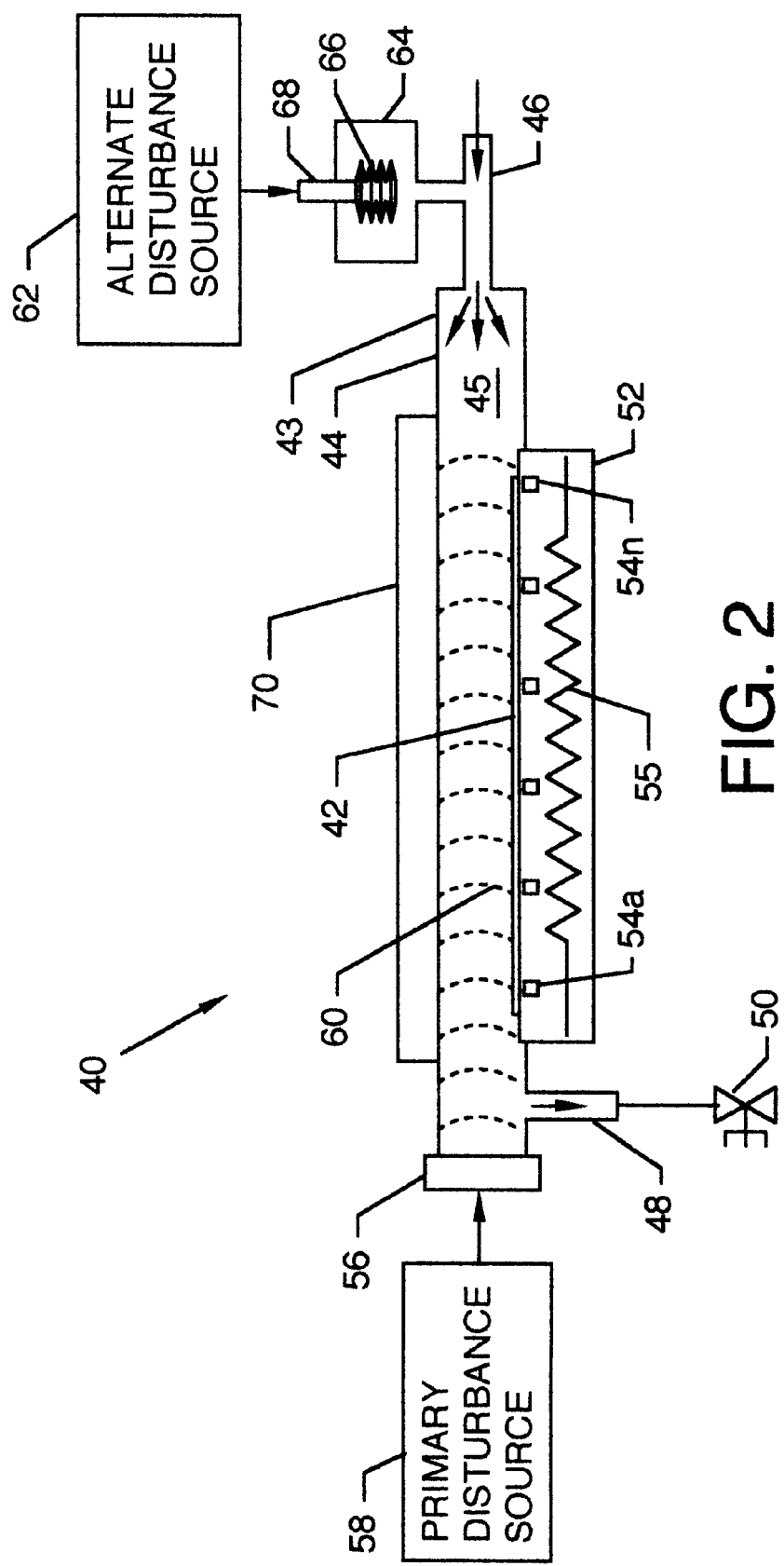

FIG. 2, the preferred embodiment, illustrates another method and apparatus according to the present invention for Metal Oxide Chemical Vapor Deposition on a substrate surface. A crossflow reactor 40 apparatus is incorporated and utilized for Metal Oxide Chemical Vapor Deposition (MOCVD) upon the upper surface of a substrate 42 positioned central to the crossflow reactor 40. The crossflow reactor 40 is a cold wall vacuum reactor comprising a horizontally oriented vessel 43 having an interior chamber 45 defined by a surrounding vessel wall 44 about and to which related structure and devices are attached or extend therefrom. A gas inlet 46 for receiving a gas from a Mass Flow Controller (MFC), not illustrated, is located at one end of the vessel 13. Opposing the gas inlet 46 and located at the opposing end of the vessel 43 is a gas outlet 48 to which a metering valve 50 is attached for control of the gases transitting through the vessel 44. A thermally conductive chuck 52 of large mass and having a substrate holding portion is utilized to hold the wafer or substrate 42 during processing. The chuck 52 is centrally located externally along the vessel 43 and extends slightly through the vessel wall 44 to place the substrate 42 carried thereby within the interior chamber 45 in a position substantially flush with the interior surface of the vessel wall 44 in order to reduce the volume of gas required and to attain good laminar flow. A suitable resistance heater 55 and one or more thermocouples 54a–54n are embedded in the chuck 52 for heating the chuck 52 and for monitoring and controlling the temperature across the chuck 52. The large mass of the chuck 52 is conducive to achieving uniform and even temperature distribution across the chuck 52 to enhance boundary layer control. One or more transducers 56 and primary disturbance sources 58, preferably in a location opposite to the gas inlet 46, are attached to the end or other suitable site on the vessel wall 44 to provide periodic disturbance in wave form into the interior chamber 45 of the vessel 43 of the crossflow reactor 40. The periodic disturbances emanating from the primary disturbance source 58, as indicated at 60 by dashed lines, can be provided by a device such as, but not limited to, a pneumatic oscillator which provides a sinusoidal disturbance. An alternate disturbance source 62 is located at the end of the vessel 43 whereat the gas inlet 46 is located; and an additional transducer 70 for providing yet another disturbance source is located along the vessel 43 on the vessel wall 44. With respect to the alternate disturbance source 62, a chamber 64 is located at and attached to the gas inlet 46 at the end of the vessel 43. An isolation bellows 66 is located in the chamber 64. An inlet 68 is attached to the chamber 64 to receive a disturbance input from the alternate disturbance source 62. The alternate disturbance source 62 introduces periodic disturbances in wave form into the interior chamber 45 of the vessel 43 of the crossflow reactor 40 through the inlet 68, the chamber 64, the isolation bellows 66 and the gas inlet 46. Both the primary and the alternate disturbance sources 58 and 62, respectively, and the additional transducer 70 can include, but are not limited to, a pneumatic oscillator, a speaker, a piezo or other electromagnetic device, or a bellows with a pneumatic source, each of which generates an appropriate disturbance.

In use, the primary disturbance source 58 and transducer 56 can be used as a stand-alone device for introduction of periodic disturbance into the interior chamber 45, but in the alternative, the additional transducer 70 located on the vessel wall 44 can be employed simultaneously. In a similar fashion, the alternate disturbance source 62, including the delivery components, can be used as a stand-alone device for introduction of periodic disturbance into the interior chamber 45, but in the alternative, the additional transducer 70 located on the vessel wall 44 can be employed simultaneously. Further, all disturbance sources, that is, the primary disturbance source 58 and transducer 56, the alternate disturbance source 62, and the additional transducer 70, can be utilized simultaneously. Other combinations incorporating the use of one or more disturbance sources, transducers and the like are also included within the scope of the invention.

Although the principle according to the present invention of utilizing disturbance sources to improve boundary layer thickness and uniformity has been described only with relation to downflow and crossflow vacuum reactors, which are the favored reactor types, those skilled in the art will recognize that the principle has application to reactors of other types including even an atmospheric pressure reactor that uses gas and boundary layer technology. Any reactor that depends on a uniform and thin boundary layer can include CVD, MOCVD, MBE, LPE and VPE.

Various modifications can be made to the present invention without departing from the apparent scope hereof.

METHOD AND APPARATUS FOR METAL OXIDE CHEMICAL VAPOR DEPOSITION ON A SUBSTRATE SURFACE
PARTS LIST

| | |
|---|---|
| 10 | downflow reactor |
| 12 | substrate |
| 13 | vessel |
| 14 | vessel wall |
| 15 | interior chamber |
| 16 | gas inlet |
| 18 | gas outlet |
| 20 | metering valve |
| 22 | chuck |
| 24a-n | thermocouples |
| 25 | resistance heater |
| 26 | chamber |
| 28 | isolation bellows |
| 29 | periodic disturbances |
| 30 | inlet |

-continued

METHOD AND APPARATUS FOR METAL OXIDE CHEMICAL
VAPOR DEPOSITION ON A SUBSTRATE SURFACE
PARTS LIST

| | |
|---|---|
| 32 | primary disturbance source |
| 33 | transducer |
| 34 | alternate disturbance source |
| 40 | crossflow reactor |
| 42 | substrate |
| 43 | vessel |
| 44 | vessel wall |
| 45 | interior chamber |
| 46 | gas inlet |
| 48 | gas outlet |
| 50 | metering valve |
| 52 | chuck |
| 54a-n | thermocouples |
| 55 | resistance heater |
| 56 | transducer |
| 58 | primary disturbance source |
| 60 | periodic disturbances |
| 62 | alternate disturbance source |
| 64 | chamber |
| 66 | isolation bellows |
| 68 | inlet |
| 70 | transducer |

It is claimed:

1. A method for improved chemical vapor deposition on a substrate surface positioned within an interior chamber of a reactor, wherein deposition occurs through a gas boundary layer, the improved method comprising the step of:

introducing a primary bellows disturbance and a secondary sonic disturbance into said interior chamber of said reactor so that the gas boundary layer is reduced in thickness and so that the gas boundary layer is more uniform.

2. A method for reducing gas boundary layer thickness and enhancing gas boundary layer uniformity during chemical vapor deposition on a surface of a substrate located within an interior chamber of a reactor, the method comprising the step of:

creating a primary bellows disturbance and a secondary sonic disturbance within said interior chamber.

3. The method as set forth in claim 2, wherein said step of creating a primary bellows disturbance and a secondary sonic disturbance within said interior chamber includes imparting a sonic disturbance into said interior chamber from a sonic disturbance generating source located outside of said interior chamber.

4. The method as set forth in claim 2, wherein said step of creating a primary bellows disturbance and a secondary sonic disturbance within said interior chamber includes imparting sonic disturbances into said interior chamber from two separate sonic disturbance generating sources located outside of said interior chamber.

5. The method as set forth in claim 2, wherein said step of creating a primary bellows disturbance and a secondary sonic disturbance within said interior chamber includes imparting sonic disturbances into said interior chamber from three separate sonic disturbance generating sources located outside of said interior chamber.

6. The method as set forth in claim 2, wherein said substrate is held by a chuck positioned entirely within said interior chamber and further comprising the step of:

vibrating or oscillating said chuck.

7. The method as set forth in claim 2, wherein said substrate is held by a chuck positioned entirely within said interior chamber and wherein said step of creating a primary bellows disturbance and a secondary sonic disturbance within said interior chamber includes imparting a sonic disturbance into said interior chamber from a sonic disturbance generating source located outside of said interior chamber and simultaneously vibrating or oscillating said chuck.

8. The method as set forth in claim 2, wherein the secondary sonic disturbance is applied into said interior chamber periodically.

9. A method for improved chemical vapor deposition on a surface of a substrate comprising the steps of:

a. providing a reactor which includes:
  (1) a vessel having a vessel wall defining an interior chamber;
  (2) a gas inlet communicating with said interior chamber;
  (3) a gas outlet communicating with said interior chamber;
  (4) a sonic disturbance generating source located outside of said interior chamber;
  (5) a chuck having a substrate holding portion, at least said substrate holding portion of said chuck being positioned within said interior chamber; and
  (6) an isolation bellows communicating with the gas inlet;

b. placing a substrate on said substrate holding portion of said chuck;

c. depositing chemical vapor onto a surface of said substrate through said gas inlet;

d. creating a disturbance within said interior chamber while said step of depositing chemical vapor onto a surface of said substrate is taking place by imparting a sonic disturbance generated by said sonic disturbance generating source into said interior chamber; and, e. oscillating the isolation bellows.

10. The method as set forth in claim 9, wherein said entire chuck is positioned within said interior chamber, and further comprising the step of vibrating or oscillating said chuck simultaneously with said imparting of said sonic disturbance into said interior chamber.

11. The method as set forth in claim 9, wherein said reactor includes a second sonic disturbance generating source located outside of said interior chamber, and wherein said step of creating a disturbance within said interior chamber while said step of depositing a chemical vapor onto a surface of said substrate is taking place includes also imparting a sonic disturbance generated by said second sonic disturbance source into said interior chamber.

12. A method for chemical vapor deposition, the method comprising the steps of:

a. providing an apparatus including:
  (1) a vessel having a vessel wall defining an interior chamber;
  (2) a gas inlet communicating with said interior chamber;
  (3) another chamber located at and attached to the gas inlet;
  (4) an isolation bellows, located in the another chamber, communicating with the gas inlet;
  (5) a gas outlet communicating with said interior chamber;
  (6) a sonic disturbance generating source providing sonic disturbance to the interior chamber;

(7) a chuck having a substrate holding portion, at least said substrate holding portion of said chuck being positioned within said interior chamber;

b. placing a substrate on said substrate holding portion of said chuck;

c. depositing chemical vapor onto a surface of said substrate through said gas inlet;

d. creating a disturbance within said interior chamber while said step of depositing chemical vapor onto a surface of said substrate is taking place by imparting a sonic disturbance generated by said sonic disturbance generating source into said interior chamber; and, e. oscillating the isolation bellows.

13. The method of claim 12, wherein the chuck is vibrated in a first direction.

14. The method of claim 13, wherein the chuck is vibrated simultaneously in a second direction.

15. The method of claim 12, wherein the gas inlet, the gas outlet, and the substrate holding portion of the chuck are arranged in a crossflow reactor orientation.

16. The method of claim 12, wherein the gas inlet, the gas outlet, and the substrate holding portion of the chuck are arranged in a downflow reactor orientation.

17. The method of claim 12, wherein the isolation bellows introduces periodic disturbances to the interior chamber through the, another chamber and the gas inlet.

18. The method of claim 12, wherein the step of oscillating the isolation bellows is sinusoidal.

19. The method of claim 12, wherein the step of oscillating the isolation bellows is pneumatically driven.

20. The method of claim 12, wherein the step of oscillating the isolation bellows is electromagnetically driven.

21. The method of claim 12, wherein the chemical vapor includes at least two components and a desired stoiciometric ratio of the at least two components arriving at the surface of the substrate though a gas boundary layer is achieved.

22. A method for chemical vapor deposition, the method comprising the steps of:

a. providing an apparatus including:

(1) a vessel having a chamber wall defining an interior chamber;

(2) a gas inlet communicating with said interior chamber;

(3) another chamber located at and attached to the gas inlet;

(4) an isolation bellows, located in the another chamber, communicating with the gas inlet;

(5) a gas outlet communicating with said chamber interior;

(6) a sonic disturbance generating source capable of providing sonic disturbance to the interior chamber;

(7) a chuck having a substrate holding portion, at least said substrate holding portion being positioned within said interior chamber;

b. placing a substrate having an uneven surface topology on said substrate holding portion of said chuck;

c. sending a chemical vapor through the gas inlet into the interior chamber, the chemical vapor having a stoiciometric ratio of vapor components;

d. forming a boundary layer between the interior chamber and the uneven surface topology of the substrate, the boundary layer having an average thickness and also having an uneven thickness defined by the uneven surface topology of the substrate and the average thickness of the boundary layer;

e. depositing vapor components of the chemical vapor in the interior chamber onto the uneven surface topology of the substrate by diffusion through the boundary layer, wherein the step of depositing through the boundary layer alters the stoiciometric ratio of the vapor components as a function of differential diffusion lengths through the boundary layer;

f. creating a sonic disturbance in the interior chamber to thin the average thickness of the boundary layer;

g. oscillating the isolation bellows to thin the average thickness of the boundary layer; and, h. whereby the thinning the average thickness of the boundary layer reduces the uneven thickness of the boundary layer such that the stoiciometric ratio of the vapor components is substantially identical to the stoiciometric ratio of the chemical vapor.

23. The method for chemical vapor deposition of claim 22, wherein thinning the boundary layer increases the rate of deposition.

24. The method of claim 22, wherein the chemical vapor includes two chemical vapor components.

25. The method of claim 22 wherein the chemical vapor includes three chemical vapor components.

26. The method of claim 22, wherein the chuck is a mass-conducting heated static chuck.

27. The method of claim 22, wherein the chuck has thermocouple imbedded in a heated stage.

28. The method of claim 22, wherein the change in average boundary layer thickness is orders of magnitude.

29. The method of claim 22, wherein the average boundary layer is thinned from about 0.80 cm to about a few microns by the combination of steps f. and g.

* * * * *